United States Patent
Chang et al.

(10) Patent No.: US 8,686,506 B2
(45) Date of Patent: Apr. 1, 2014

(54) HIGH PERFORMANCE DEVICES AND HIGH DENSITY DEVICES ON SINGLE CHIP

(75) Inventors: Leland Chang, New York, NY (US); Isaac Lauer, Mahopac, NY (US); Jeffrey Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 13/571,734

(22) Filed: Aug. 10, 2012

(65) Prior Publication Data

US 2012/0299107 A1   Nov. 29, 2012

Related U.S. Application Data (62) Division of application No. 12/781,896, filed on May 18, 2010, now Pat. No. 8,338,239.

(51) Int. Cl.
*H01L 29/72* (2006.01)

(52) U.S. Cl.
USPC ........... 257/351; 257/241; 257/255; 257/368; 257/369; 257/499; 257/E27.112

(58) Field of Classification Search
USPC ................. 257/241, 255, 351, 368, 369, 499, 257/E27.112
See application file for complete search history.

(56) References Cited

U.S. PATENT DOCUMENTS

| | | | |
|---|---|---|---|
| 6,071,767 A | 6/2000 | Monkowski et al. | |
| 2007/0108526 A1 | 5/2007 | Kohyama | |
| 2007/0158743 A1 | 7/2007 | Chang et al. | |
| 2008/0036006 A1 * | 2/2008 | Ueno et al. | 257/369 |
| 2009/0273988 A1 | 11/2009 | Flaker et al. | |
| 2011/0006373 A1 * | 1/2011 | Eller et al. | 257/369 |

OTHER PUBLICATIONS

Isaac, The future of CMOS technology, IBM J. Res. Develop., May 3, 2000, pp. 369-378, vol. 44, No. 3, IBM Corporation.
Haensch et al., Silicon CMOS devices beyond scaling, IBM J. Res. & Dev., Jul./Sep. 2006, pp. 339A-361A, vol. 50, No. 4/5, IBM Corporation.
Leong et al., Silicon Device Scaling to the Sub-10-nm Regime, Science AAAS, Dec. 17, 2004, pp. 2057-2060, vol. 306, ScienceMag.org.
Leong et al., Transistor scaling with novel materials, MaterialsToday, Jun. 2006, pp. 26-31, vol. 9., No. 6, Elsevier Ltd.

\* cited by examiner

*Primary Examiner* — Edward Wojciechowicz
(74) *Attorney, Agent, or Firm* — Cantor Colburn LLP; Vazken Alexanian (57) ABSTRACT

A CMOS chip comprising a high performance device region and a high density device region includes a plurality of high performance devices comprising n-type field effect transistors (NFETs) and p-type field effect transistors (PFETs) in the high performance device region, wherein the high performance devices have a high performance pitch; and a plurality of high density devices comprising NFETs and PFETs in the high density device region, wherein the high density devices have a high density pitch, and wherein the high performance pitch is about 2 to 3 times the high density pitch; wherein the high performance device region comprises doped source and drain regions, NFET gate regions having an elevated stress induced using stress memorization technique (SMT), gate silicide and source/drain silicide regions, and a dual stressed liner, and wherein the high density device region comprises doped source and drain regions, gate silicide regions, and a neutral stressed liner.

9 Claims, 9 Drawing Sheets

HIGH PERFORMANCE DEVICES AND HIGH DENSITY DEVICES ON SINGLE CHIP

CROSS REFERENCE TO RELATED APPLICATION

This application is a divisional of U.S. application Ser. No. 12/781,896, filed on May 18, 2010, the disclosure of which is incorporated by reference herein in its entirety.

FIELD

This disclosure relates generally to the field of complementary metal-oxide-semiconductor device fabrication.

DESCRIPTION OF RELATED ART

As complementary metal-oxide-semiconductor (CMOS) devices, such as n-type field effect transistors (NFETs) and p-type field effect transistors (PFETs), are scaled to smaller sizes, the scaling density may negatively affect device performance. Various carrier mobility enhancement techniques may be used to increase CMOS device performance; however, as size is further reduced, such mobility enhancement techniques may degrade in effectiveness.

SUMMARY

In one aspect, a complementary metal-oxide-semiconductor (CMOS) chip comprising a high performance device region and a high density device region includes a plurality of high performance devices comprising n-type field effect transistors (NFETs) and p-type field effect transistors (PFETs) in the high performance device region, wherein the high performance devices have a high performance pitch; and a plurality of high density devices comprising NFETs and PFETs in the high density device region, wherein the high density devices have a high density pitch, and wherein the high performance pitch is about 2 to 3 times the high density pitch; wherein the high performance device region comprises doped source and drain regions, NFET gate regions having an elevated stress induced using stress memorization technique (SMT), gate silicide and source/drain silicide regions, and a dual stressed liner, and wherein the high density device region comprises doped source and drain regions, gate silicide regions, and a neutral stressed liner.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a single chip comprising regions of high performance devices and high density devices, and a method of fabrication for a single chip comprising regions of high performance devices and high density devices, are provided, with exemplary embodiments being discussed below in detail. Devices that have a relatively high density may be implemented on the same wafer, or chip, as relatively high power and performance devices. Both types of devices may comprise planar CMOS devices, including NFETs and PFETs. The high density regions of the chip may be used for memory arrays or cache, while the high performance regions may perform logic operations for the chip. The pitch (i.e., the distance between the device gates) in the high performance region may be 2 to 3 times the pitch in the high density region in some embodiments. The high performance region may be formed using silicide gates and source/drain diffusions, mobility enhancements such as stress memorization technique (SMT), embedded silicon germanium (SiGe) for PFET source/drain regions, embedded silicon carbide (SiC) for NFET source/drain regions, dual stressed liners, and any other appropriate performance enhancing techniques, while the high density region may optionally not comprise such techniques. Omission of use of silicide or use of very thin silicide in the high density diffusion region in particular allows for reduced spacer dimensions, allowing smaller pitch. The final structure comprises side-by-side regions of high performance and high density devices on same chip.

Figure 1:
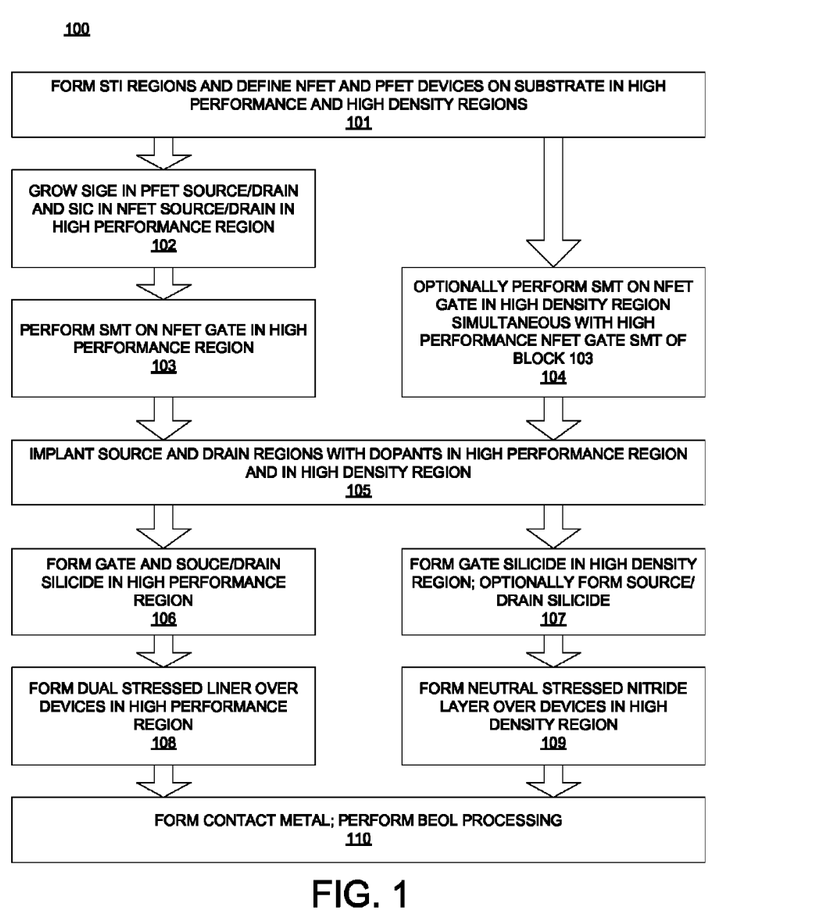
FIG. 1 illustrates an embodiment of a method of fabricating a chip comprising high performance and high density device regions.

FIG. 1 illustrates an embodiment of a method of fabricating a chip comprising high performance and high density device regions. FIG. 1 is discussed with respect to FIGS. 2-9. While the chip substrate shown in FIGS. 2-9 comprises silicon-on-insulator (SOI) comprising silicon layer 202, oxide layer 201, and silicon layer 213, a bulk silicon substrate may be used as the substrate in some embodiments.

Figure 2:
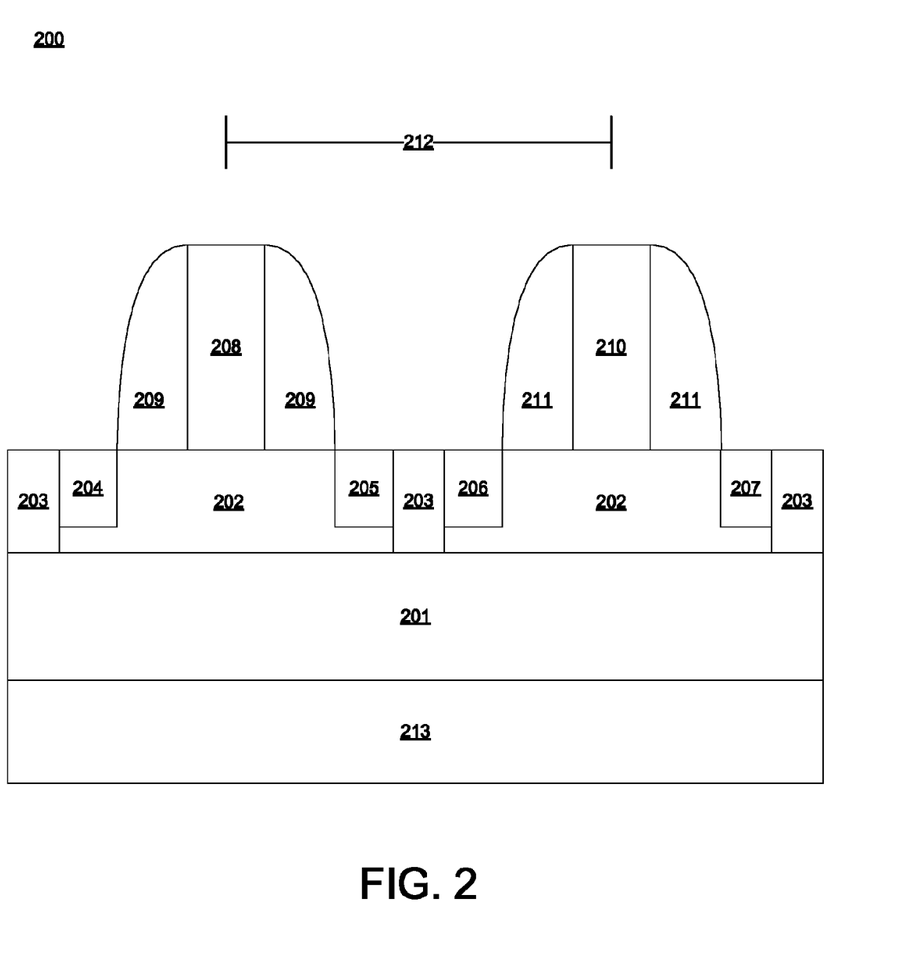
FIG. 2 illustrates an embodiment of an NFET and a PFET formed in a high performance region.
Figure 6:
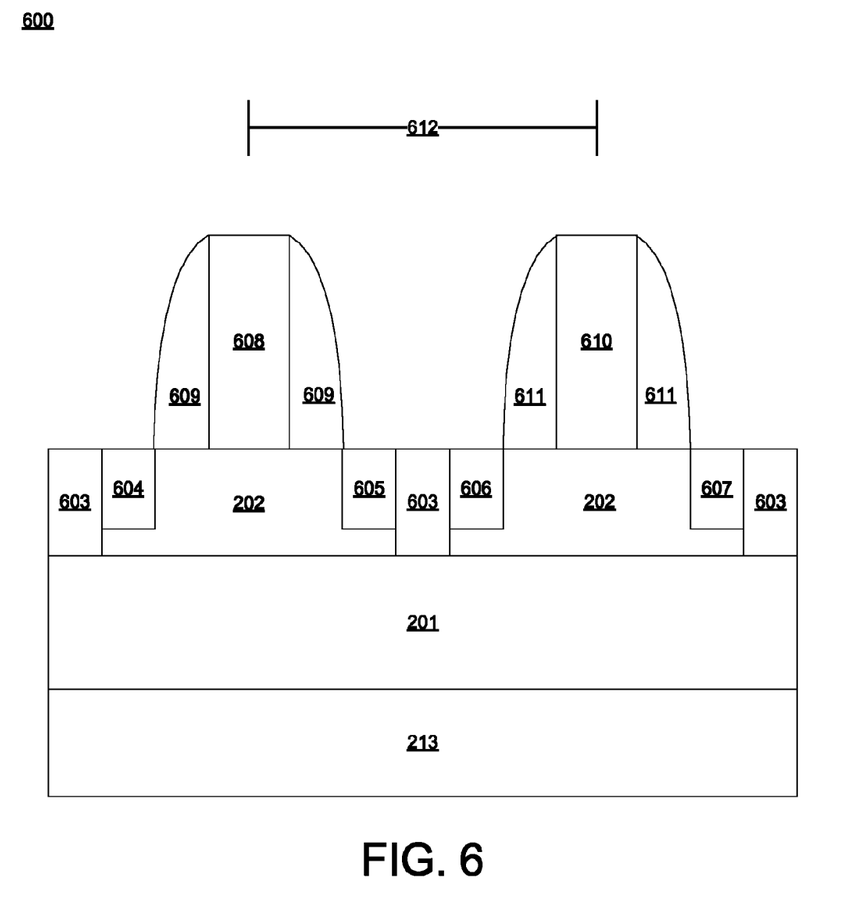
FIG. 6 illustrates an embodiment of an NFET and a PFET formed in a high density region.

In block 101, a high performance device region 200 and a high density device region 600, each comprising shallow trench isolation (STI) regions separating NFET and PFET devices, are defined in the same substrate (comprising silicon layer 202, oxide layer 201, and silicon layer 213), as shown in FIGS. 2 and 6. The high performance region 200 comprises an NFET device having a gate 208, spacers 209, source region 204 and drain region 205, and a PFET device having a gate 210, spacers 211, source region 206, and drain region 207. Gate 208 and gate 210 are separated by a distance, or pitch, 212. The NFET device and the PFET device in the high performance region 200 are separated by STI regions 203; STI regions 203 may comprise trenches filled with oxide. The high density region 600 as shown in FIG. 6 comprises an NFET device comprising a gate 608, spacers 609, source region 604 and drain region 605, and a PFET device comprising a gate 610, spacers 611, source region 606, and drain region 607. Gate 608 and gate 610 are separated by a distance, or pitch, 612; pitch 212 (of FIG. 2) may be 2 to 3 times pitch 612 in some embodiments. The NFET device and the PFET device in the high performance region 600 are separated by STI regions 603; STI regions 603 may comprise trenches filled with oxide.

Spacers 209, 211, 609, and 611 may comprise nitride, and may be formed by deposition of nitride followed by etching in some embodiments. Spacers 609 and 611 of FIG. 6 have smaller dimensions than spacers 209 and 211 of FIG. 2. During spacer formation in high density region 600, the high performance region 200 may be masked, so that spacers 609 and 611 may be etched to achieve smaller dimensions than spacers 209 and 211. Alternately, less spacer material may be deposited in the high density region 600 than in high performance region 200, and the same etch may be used for both spacers 209 and 211 and spacers 609 and 611, or spacers 209 and 211 may each comprise two spacers formed together, resulting in greater final thickness for spacers 209 and 211.

Following block 101, in block 102, embedded material is formed in the source and drain regions of the high performance region 200. NFET source 204 and drain 205 may comprise embedded SiC, and may be formed by forming trenches in silicon layer 202, and growing SiC in the trenches. PFET source 206 and drain 207 may comprise embedded SiGe, and may be formed by forming trenches in silicon layer 202, and growing SiGe in the trenches. A hard mask may be used to protect PFET source 206 and drain 207 during growth of the NFET source 204 and drain 205 material, and vice versa. Also, during the SiGe and SiC growth of block 102 in high performance region 200, high density region 600 may be protected using, for example, a nitride hard mask.

Next, in block 103, SMT is performed on the NFET gate 208 in the high performance region 200 to enhance the mobility of the high performance NFET devices. SMT is performed by masking the NFET with a tensile stressed nitride layer, annealing the masked NFET to induce a permanent stress in the NFET gate 208, and then removing the tensile stressed nitride layer. In some embodiments, SMT may optionally be simultaneously performed in the same manner on the NFET gate 608 of high density region 600 in block 104.

Figure 3:
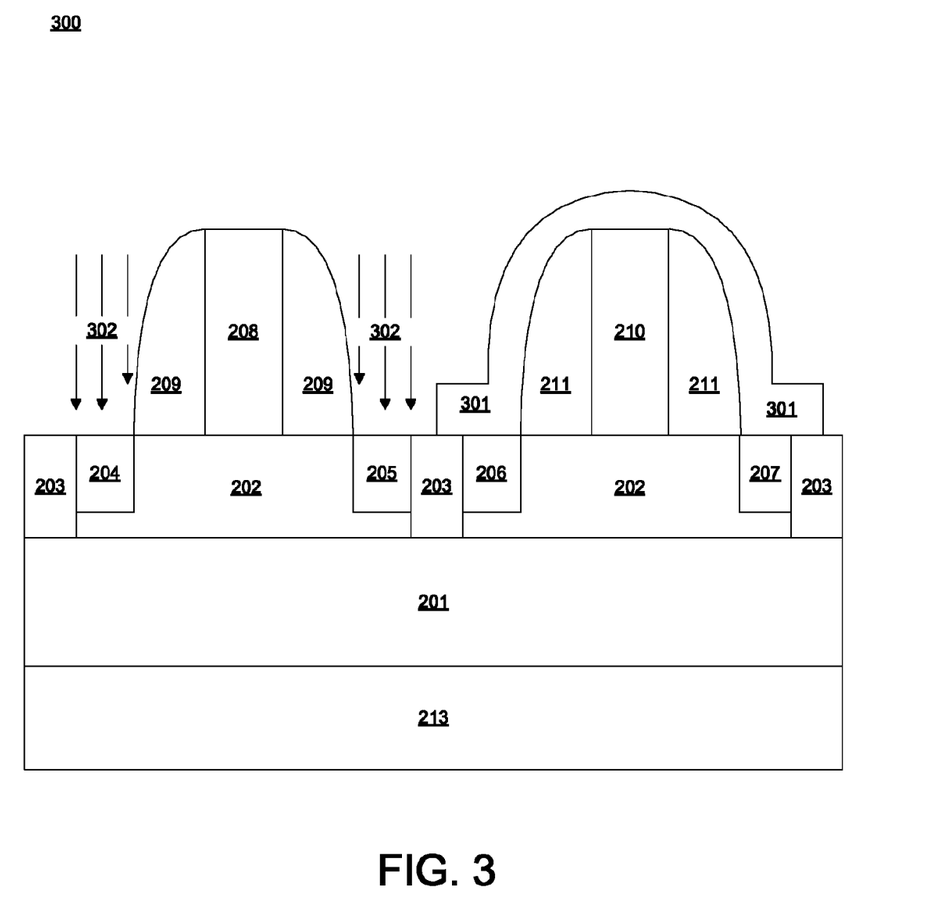
FIG. 3 illustrates an embodiment of the device of FIG. 2 during implantation.
Figure 7:
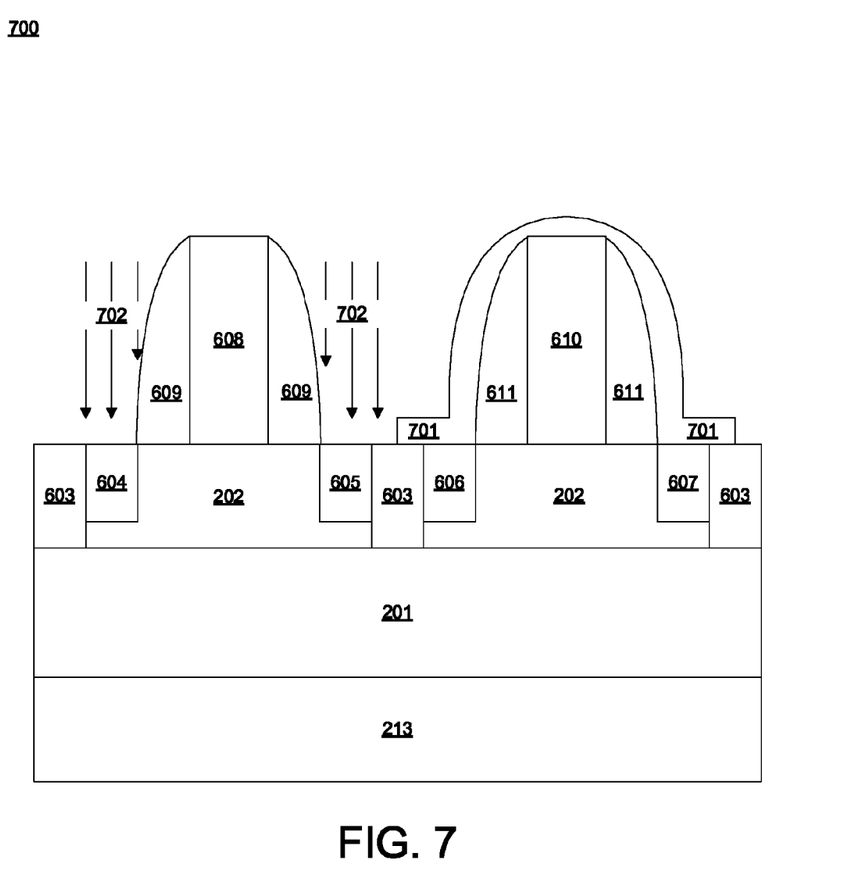
FIG. 7 illustrates an embodiment of the device of FIG. 6 during implantation.
Figure 8:
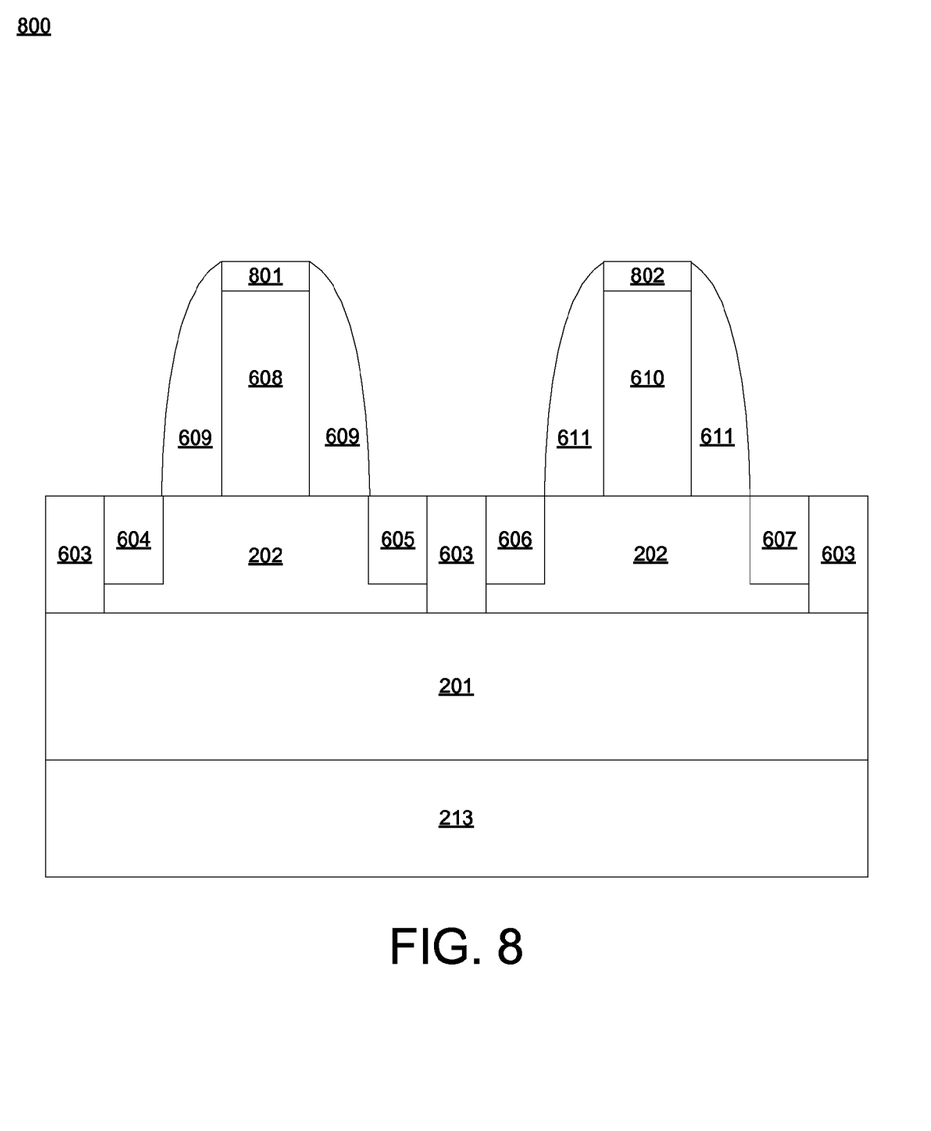
FIG. 8 illustrates an embodiment of the device of FIG. 7 after formation of gate silicide regions.

After completion of SMT in blocks 103 and 104, source and drain implantation and diffusion are simultaneously performed in the high performance region 300 and the high density region 700 in block 105, as shown in FIGS. 3 and 7. In some embodiments, the PFET gates 210 and 601, spacers 211 and 611, source regions 206 and 606, and drain regions 207 and 607 are first masked using mask 301 and mask 701, and NFET sources 204 and 604 and drains 205 and 605 are implanted with n-type dopants 302 and 702. The mask is then removed from the PFETs, the NFETs in both regions are masked, and the PFET source regions 206 and 606 and drain regions 207 and 607 are implanted with p-type dopants. The mask is then removed from the NFETs. In other embodiments, the NFETs may be masked and PFET implantation may be performed first, and followed by PFET masking and NFET implantation. The device regions 300 and 700 are then annealed to diffuse the respective implanted n-type and p-type dopants into source regions 204, 604, 206, and 606, and into drain regions 205, 605, 207, and 607.

Figure 4:
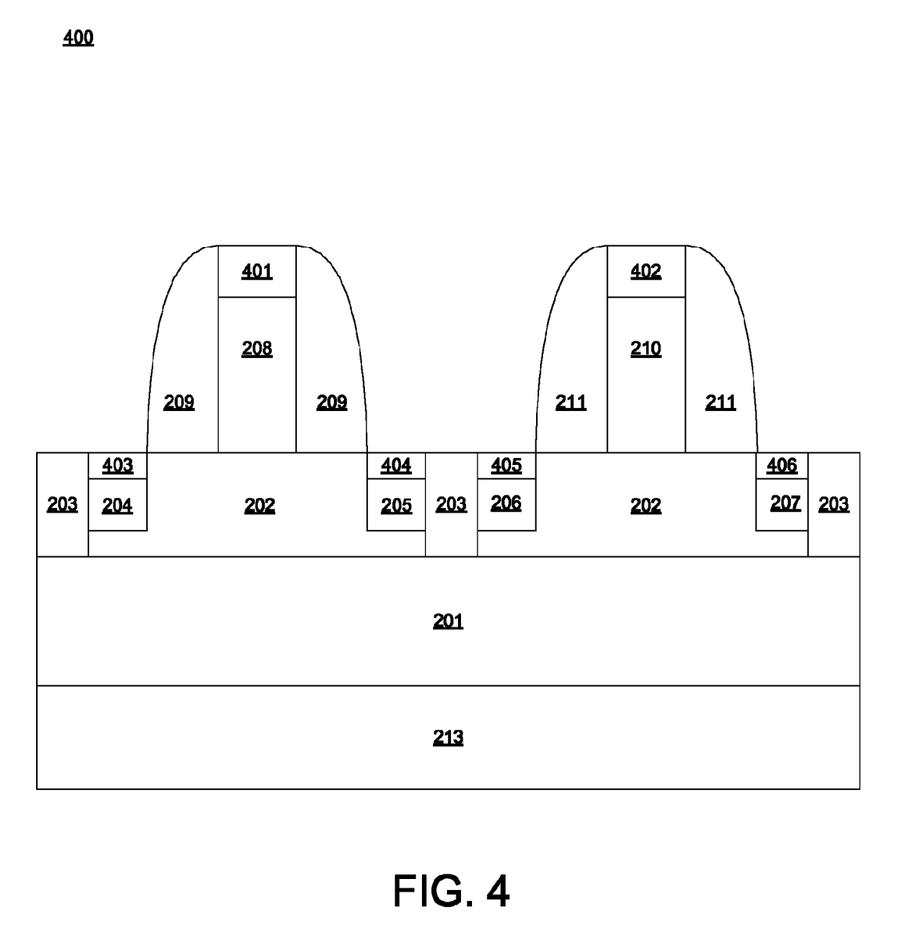
FIG. 4 illustrates an embodiment of the device of FIG. 3 after formation of gate and source/drain silicide regions.

Next, in block 106, gate silicide regions 401 and 402 are formed in gates 208 and 210 in high performance region 400, as shown in FIG. 4. Gate silicide regions 401 and 402 comprise gate contacts for the NFET and PFET devices, and may comprise nickel, nickel platinum, or cobalt in some embodiments. Source and drain silicide regions 403, 404, a405, and 406 are simultaneously formed in source/drain regions 204, 205, 206, and 207. In block 107, gate silicide regions 801 and 802 are also formed in high density region 800 of FIG. 8 in block 107 simultaneous with formation of silicide in the high performance region 400 in block 106. Source and drain silicide (not shown) may also be optionally formed in high density region 800 in block 107 in some embodiments, or in other embodiments source and drain regions 604, 605, 606, and 607 in high density device region 800 may be masked during silicide formation.

Figure 5:
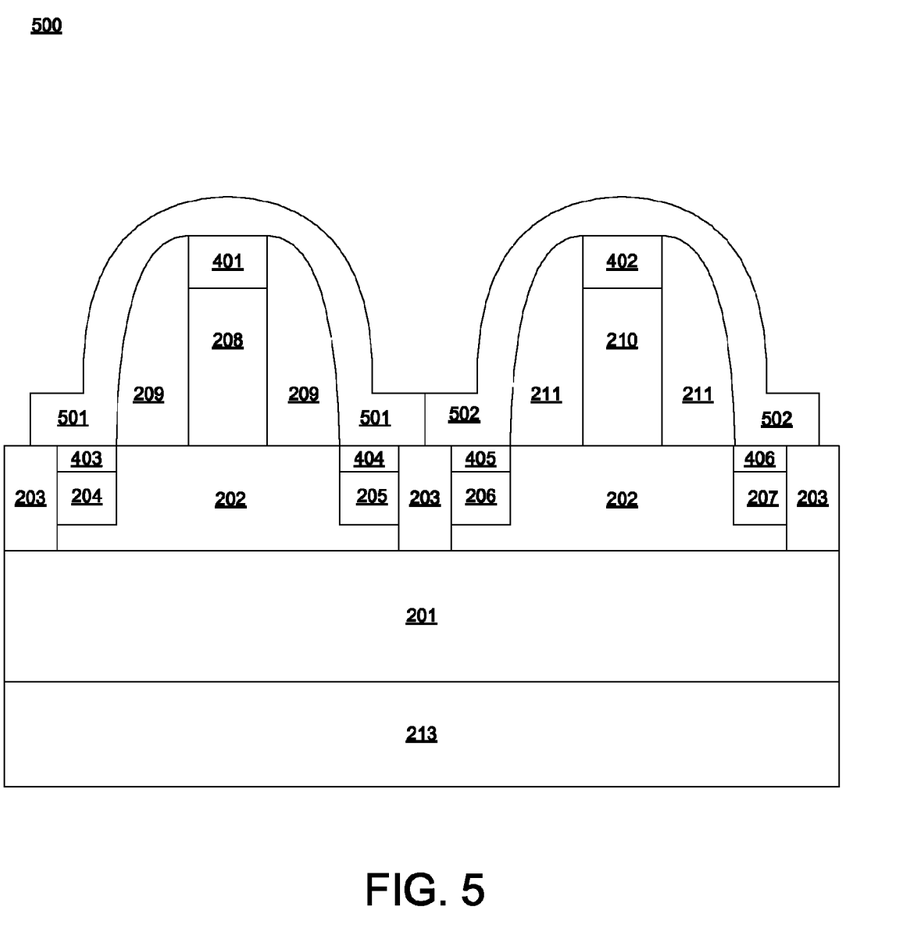
FIG. 5 illustrates an embodiment of the device of FIG. 4 after formation of a dual stressed liner.
Figure 9:
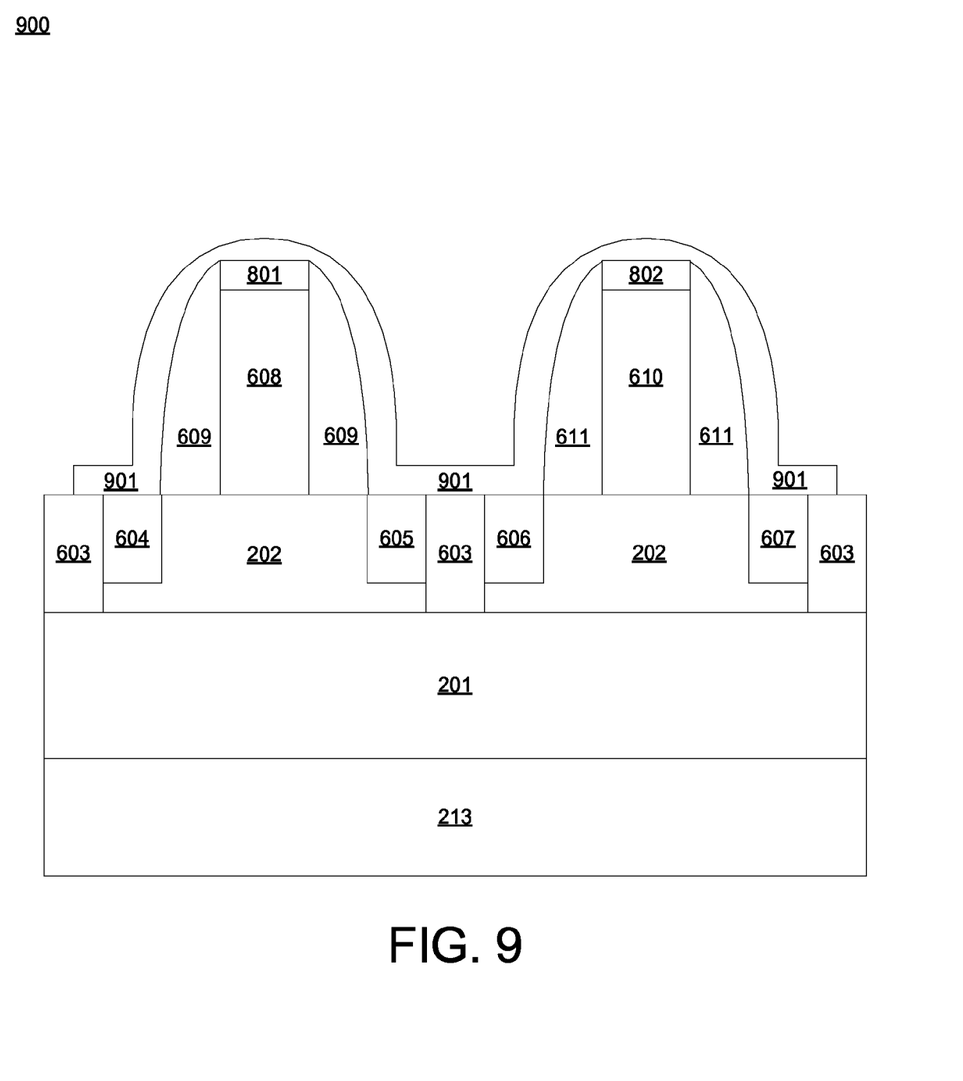
FIG. 9 illustrates an embodiment of the device of FIG. 8 after formation of a neutral stressed nitride layer.

After completion of blocks 106 and 107, in blocks 108 and 109 liners are formed over the high performance region and the high density region, as shown in FIGS. 5 and 9. Dual stressed liners 501 and 502 are formed on the high performance device region 500, resulting in high performance CMOS device region 500 as shown in FIG. 5. Liner 501 comprises a layer of tensile stressed nitride deposited over the high performance NFET, and liner 502 comprises a layer of compressive stressed nitride deposited over the high performance PFET. Nitride layers 501 and 502 act to improve the performance of the NFET device and the PFET device, respectively. Also, in block 109, neutral stressed nitride layer 901 is formed over high density device region 900, resulting in high density CMOS device region 900 as shown in FIG. 9. Block 109 may be performed before block 108 in some embodiments. Nitride layer 901 acts to protect high density CMOS device region 900. High density CMOS device region 900 and high performance CMOS region 500 are located on a single chip. High performance CMOS device region 500 is shown for illustrative purposes only; a high performance CMOS device region may comprise any appropriate number and type of CMOS devices. High density CMOS device region 900 is shown for illustrative purposes only; a high density CMOS device region may comprise any appropriate number and type of CMOS devices. Lastly, flow proceeds from blocks 108 and 109 to block 110, in which contact metal formation and back end of line (BEOL) operations are performed on the chip comprising high performance device region 500 and high density device region 900 in block 110.

The technical effects and benefits of exemplary embodiments include a chip that comprises a high performance portion that is optimized for logic operations, and a high density portion that is optimized for storage operations.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A complementary metal-oxide-semiconductor (CMOS) chip comprising a high performance device region and a high density device region, comprising:
   a plurality of high performance devices comprising n-type field effect transistors (NFETs) and p-type field effect transistors (PFETs) in the high performance device region, wherein the high performance devices have a high performance pitch; and
   a plurality of high density devices comprising NFETs and PFETs in the high density device region, wherein the high density devices have a high density pitch, and wherein the high performance pitch is about 2 to 3 times the high density pitch;
   wherein the high performance device region comprises doped source and drain regions, NFET gate regions having an elevated stress induced using stress memorization technique (SMT), gate silicide and source/drain silicide regions, and a dual stressed liner, and wherein the high density device region comprises doped source and drain regions, gate silicide regions, and a neutral stressed liner.

2. The chip of claim 1, wherein the source and drain regions of the NFETs in the high performance device region comprise silicon carbide.

3. The chip of claim 1, wherein the source and drain regions of the PFETs in the high performance device region comprise silicon germanium.

4. The chip of claim 1, wherein the neutral stressed nitride liner comprises nitride.

5. The chip of claim 1, wherein the high density device region comprises NFET gate regions having an elevated stress induced using SMT performed simultaneously with the SMT of the high performance device region.

6. The chip of claim 1, wherein the high density device region further comprises source/drain silicide regions.

7. The chip of claim 1, wherein the dual stressed liner comprises a layer of tensile stressed nitride over the NFETs, and a layer of compressive stressed nitride over the PFETs.

8. The chip of claim 1, wherein the gate silicide and source/drain silicide comprises one of nickel, nickel, platinum, and cobalt.

9. The chip of claim 1, wherein the high density device region comprises a memory portion of the chip, and the high performance device region comprises a logic portion of the chip.

* * * * *